United States Patent [19]

Hower et al.

[11] Patent Number: 4,551,353
[45] Date of Patent: Nov. 5, 1985

[54] METHOD FOR REDUCING LEAKAGE CURRENTS IN SEMICONDUCTOR DEVICES

[75] Inventors: Philip L. Hower, Concord; Eric K. Li, Cambridge, both of Mass.

[73] Assignee: Unitrode Corporation, Lexington, Mass.

[21] Appl. No.: 633,675

[22] Filed: Jul. 24, 1984

Related U.S. Application Data

[63] Continuation of Ser. No. 335,696, Dec. 30, 1981, abandoned.

[51] Int. Cl.[4] .......................................... H01L 21/326
[52] U.S. Cl. ...................................... 427/39; 29/584; 427/82; 204/164; 357/52
[58] Field of Search .............. 29/584; 357/52; 427/39, 427/82; 204/164

[56] References Cited

U.S. PATENT DOCUMENTS

| | | | |
|---|---|---|---|
| 2,221,338 | 11/1940 | Wintermute | 427/39 |
| 3,879,183 | 4/1975 | Carlson | 427/39 |
| 3,895,127 | 7/1975 | Comizzoli | 427/39 |
| 4,007,294 | 2/1977 | Woods | 427/39 |

OTHER PUBLICATIONS

Kerr, "Effect of Temperature and Bias on Glass-Silicon Interfaces, IBM Journal, Sep. 1964, pp. 385-393.
Summers et al., "Control of Silicon-Glass Interface Potential", IBM TDB, vol. 8, No. 7, Dec. 1965, p. 1012.
Kerr, "A Review of Instability Mechanisms in Passivation Films", Conference: 8th Annual Reliability Physics Symposium, Las Vegas, Nev., Apr. 7-10, 1970.

*Primary Examiner*—John D. Smith
*Attorney, Agent, or Firm*—Weingarten, Schurgin, Gagnebin & Hayes

[57] ABSTRACT

A method for reducing leakage currents in passivated semiconductor devices includes subjecting the passivation layer to a corona discharge for reducing or eliminating the inversion layer produced by the characteristic passivation layer charge.

15 Claims, 6 Drawing Figures

METHOD FOR REDUCING LEAKAGE CURRENTS IN SEMICONDUCTOR DEVICES

This application is a continuation of application Ser. No. 335,696, filed Dec. 30, 1981 now abandoned.

FIELD OF INVENTION

This invention relates to the passivation of semiconductor devices and more particularly to a method and apparatus for reducing leakage currents caused by the charge carried by the passivation layer.

BACKGROUND OF THE INVENTION

Glasses of various compositions are frequently used to seal exposed silicon surfaces of solid state electronic devices, particularly areas adjacent to the intersection between regions of opposite conductivity type. The glass layer is used to properly passivate the surface by preventing undersirable surface effects from influencing device characteristics. For example, in a thyristor which is a 4 layer p-n-p-n switching device such as a silicon-controlled rectifier (SCR) or a three-element static a-c switch (TRIAC), the junction between the p+ anode or gate layers and the n− layer is intersected by a moat etched into the silicon wafer. Typically lead-boro-silicate or lead-boro-alumino-silicate glasses are utilized for thyristor passivation in which the glass layer is patterned and deposited into and around the moat. After patterning, the passivation layer is fired. However, passivation layers such as noted above have a tendency to carry a negative charge after firing. In addition, certain organic passivation layers also tend to acquire a charge after an annealing or heat treatment step, or after a bias stress test.

Excessive negative passivation layer charge can cause an inversion of the silicon surface underneath it, in which the negative charge in the passivation layer is balanced by a positively charged depletion layer plus a positively charged inversion layer consisting of mobile carriers, i.e. holes. This inversion layer is within the silicon crystal adjacent to the passivation layer.

The inversion layer is undesirable because it forms a channel or conducting leakage path between layers of semiconductor material of opposite conductivity type. For instance in the aforementioned thyristor, excessive negative charge in the passivation layer causes a conductive path between the anode of the device and the severely damaged scribe line at the edge of the individual die or wafer. The scribe line is created during separation of semiconductor devices fabricated on a large substrate. The excessive negative charge also creates a conductive path between the scribe line and the gate of the device, such that there is a leakage path between anode and gate which can cause the thyristor to turn on. It is observed that the inversion layer current increases rapidly with temperature, and can cause thyristor turn-on from a forward blocking state as the temperature rises. The reason for the thyristor tunr-on is that current from the anode is channeled through inversion layers to and from the scribe line directly to the gate. This current in effect becomes the gate current and is oftentimes sufficient to turn on the device. Since current generation and inversion layer conductivity both rise rapidly with temperature, thyristors turn on at lower applied voltages when they are subjected to elevated temperatures.

The above-mentioned leakage path caused by the inversion layer can be observed before scribing by I-V probing between adjacent anodes or gates. In I-V probing an increasing voltage is applied between adjacent gates or anodes and the corresponding leakage current is recorded. The leakage current is a combination of the relatively low leakage through the bulk of the semiconductor material and the leakage at the surface of the wafer underneath the passivation layer between the two adjacent gates or anodes. When the surface leakage due to the inversion layer is eliminated, the leakage current drops markedly and corresponds to the relatively low bulk leakage. The I-V probing technique thus establishes a base line from which to measure inversion layer leakage and thus the extent of the inversion layer.

Given a fixed or predetermined glass composition, previous well known methods of varying glass process variables, such as the temperature of firing or annealing, the firing cycle, and the firing atmosphere, often offer only a limited degree of control over the final glass charge.

It is known that the glass charge can be altered in either direction in a controllable manner after firing by applying combined voltage bias and temperature stress and that different glass compositions require different temperatures before significant shift in the glass charge, on the order of $10^{11}$ per $cm^2$, occurs. The glass charge dependence on voltage bias and temperature stress is described in an article in the IBM Journal, September 1964, pps. 385–393, by D. R. Kerr.

One method of reducing glass charge by applying voltage bias requires formation of metal electrodes on the top of the passivation layer, a process incompatible with electroless metalization. This process is also incompatible with other metalization processes, since for the thyristor, electrodes must be deposited on both sides of a silicon wafer, and both top and bottom wafer surfaces must be biased to the same polarity versus the silicon bulk.

By way of further background, corona discharges have been utilized as a diagnostic tool to charge glass passivation layers or overcoats for the positioning of toning particles which are deposited over the semiconductor surface. Defects show up quite readily when the toning particles accumulate in various charged areas of the semiconductor surface. In this diagnostic technique a corona discharge is applied to the semiconductor surface for only a very short period of time which is too short to affect the inversion layer and therefore too short to reduce leakage. Such a diagnostic technique is described in the Journal of Vacuum Science Technology, 14, 32 (1977), by W. Kern and R. B. Comizzoli. Note also that the constituents of corona discharges are discussed in an article entitled Mass Spectrometric Studies of Corona Discharges in Air at Atmospheric Pressures, The Journal of Chemical Physics, Vol. 43, No. 7, Oct. 1, 1966, by M. M. Shahin.

While the above problem has been described in connection with thyristors, the problem of passivation-induced leakage currents is prevalent in any types of semiconductor devices, whether PNP or NPN devices.

SUMMARY OF THE INVENTION

In order to reduce passivation-induced leakage, in the subject invention a wafer having an in-place passivation layer is subjected to a corona discharge for a time sufficient to reduce or eliminate the inversion layer. In a preferred embodiment the wafer is heated during corona discharge. If the corona discharge is left on during cooling of the wafer, there is no upper temperature limit other than the melting or physical destruction of the passivation layer. On the other hand, if the corona discharge is turned off prior to cooling, then there are time/temperature constraints. In this latter case, the wafer is heated to a temperature below the fusing or curing temperature of the passivation layer, and indeed below the temperature at which the passivation layer takes on a charge in a time period equal to the cooling time without the corona. It has been found that there are a set of time/temperature conditions above which the passivation layer takes on a charge. These are called the "charge creation conditions" and refers to that set of temperatures and times above which charge starts to form in the passivation layer.

For a certain class of passivation layers, the charge creation conditions can be defined by a curve on a temperature vs. time graph, with permissible operating points being those to one side of the curve. In general, if the corona discharge is not left on during cooling, the desired time/temperature combination is that operating point representing the highest permissible temperature and shortest time period. Alternatively, other permissible operating points may be chosen based on other factors such as solder temperature. As an example of how the temperature vs. time graph is generated, for a one hour time period, a lead-boro-silicate glass passivation layer takes on its typical negative charge at approximately 450° C. For two hours the glass takes on its typical negative charge at 420° C. The charge creation conditions are determined experimentally for each type of passivation layer by the aforementioned I-V probing.

In one embodiment, the corona discharge achieved through the use of a corona wire, is composed of positive ions believed to be $(H_3O)^{30}$ or $(H_2O)_nH^+$. This discharge is directed towards the negatively charged passivation layer on one side of a wafer by establishing a potential difference between the corona wire and the wafer in a direction that causes the positive ions to move towards the wafer so as to at least in part neutralize the negative charge carried by the passivation layer. This process in turn minimizes or eliminates the creation of an inversion layer in the adjacent semiconductor material such that a leakage channel is either prevented from forming or is reduced in extent. Since the wafer is an electrical conductor, the potential difference to direct the discharge towards the wafer may be established by effectively connecting the wafer, for instance at its solder bumps, to one side of the high voltage corona discharge power supply. The wafer may then be turned over for processing the passivation layer on the reverse side. Note that the corona discharge is made up of ions and thus any ion generator is within the scope of this invention.

The time and temperature constraints for this treatment process are different for different passivation layers and are set experimentally to achieve zero "surface" current in the shortest period of time. The surface current is determined by subjecting a wafer to I-V probing between adhacent anodes or gates. It has been found that elimination of the inversion layer proceeds more quickly for higher wafer temperatures.

In the large majority of cases, leakage is reduced by two orders of magnitude and is a long-term phenomenon. While the reason for the long-lived benefit is not known, the longevity of the result is thought to be in part due to the following chemical reaction, the direction of which is temperature dependent:

$$H_3O^+ + OH^- \rightarrow 2H_2O$$

where T < fusing, curing or charge creating conditions.

In one embodiment, a positive voltage of more than 5,000 volts is applied to the corona wire and a heated wafer is subjected to the corona discharge for a time period on the order of one-half hour. The wafer may be cooled to ambient temperature either during the corona discharge or with the corona discharge turned off. As a result, the leakage current can be reduced from the microampere range to the nanoampere range after treatment. The degree of improvement depends upon the applied voltage, the length of time for the treatment and the temperature of the wafer, with the improvement being two orders of magnitude improvement in the large majority of cases.

In another embodiment, the wafer is heated with no limit on temperature and is subjected to a corona discharge for a time sufficient to reduce the inversion layer. Thereafter, the wafer is cooled with the corona discharge left on until the wafer reaches the charge creation condition temperature.

The amount of improvement necessarily depends on the type of passivation layer utilized, the type of device tested, and the parameters of the test. It is, however, a finding of the subject invention that leakage current can be dramatically reduced by subjecting the passivation layer to an appropriately polarized corona discharge for a sufficiently long period of time.

The above process parameters are included for illustrative purposes only and this invention is not limited to any particular set of parameters or any particular theory of operation. Moreover, leakage need not necessarily occur at a scribe line, although the effect of scribe line leakage is often severe. In addition to causing device failure, passivation layer charge can contribute significantly to the alteration of device characteristics such as bias voltage, and can require different doping levels than would ordinarily be expected.

Note the the aforementioned lead-boro-silicate and lead-boro-aluminosilicate glasses are available commercially such as Innotech's model IP820 and IP830.

BRIEF DESCRIPTION OF THE DRAWINGS

These and other features of the subject invention will be better understood in connection with the detailed description takin in conjunction with the figures of which.

DETAILED DESCRIPTION OF THE INVENTION

As mentioned hereinbefore, passivation layers can carry a net negative charge after firing or annealing which negative charge can cause an inversion in the semiconductor material immediately adjacent the passivation layer. When the passivation layer spans a junction between opposite type semiconductor material, an inversion layer may, in effect, short out the junction. This either contributes to the complete malfunctioning of the device, or at least to an alteration of the characteristics of the device, both electrical and physical.

Figure 1:
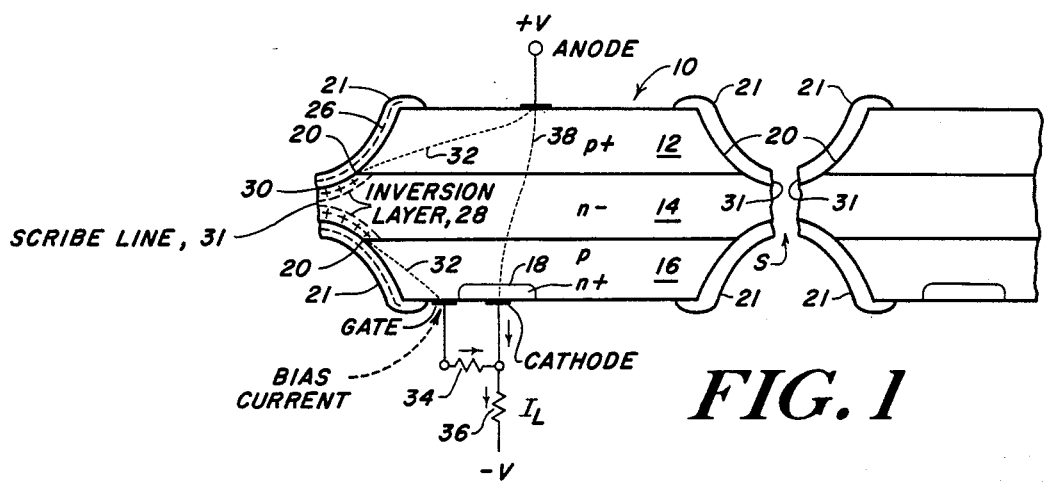
FIG. 1 is a diagrammatic illustration of the creation of an inversion channel adjacent a passivation layer carrying a negative charge, also showing the resulting scribe line when portions of a semiconductor wafer are separated.

Referring now to FIG. 1, a typical four layer device 10 is illustrated as having alternating layers 12, 14, 16 and 18 of semiconductor material which together form a wafer of semiconductor material. Layer 12 forms an anode for the finished device, with layer 18 forming the gate. Moats 20 are formed to either side of what will become a finsihed device. In general, a passivation layer 21 is patterned or deposited within a moat, with the layer being fired at a temperature usually exceeding 300° C. The firing of the passivation layer produces negative charge, here illustrated at 26, which produces a P type inversion layer 28 made up of positive charge 30. The devices are separated as illustrated at S, usually by a scribing technique which results in scribe lines 31 being formed at least across the junction between the passivation layer and one layer of semiconductor material.

Inversion layer 28 provides a conductive channel between the adjacent scribe line and layer 12, which in this case is of a P type. Thus, positive charged carries (holes) are permitted to traverse the boundary between the P type material and the N type material which, in effect, connects the anode of the device, layer 12, to the scribe line. The scribe line is a damaged region and acts like a conducting layer. If inversion layers 28 are formed adjacent to the surfaces of both of the moats, there will be a conducting path 32 between anode and gate. This path can have a conductance which is large enough to cause thyristor turn-on at undesired times.

For normal turn-on of thyristors, one applies a positive gate current to the gate which causes the cathode gate junction (n+p) to inject. In the off or forward blocking state, a leakage current will flow from anode to cathode. If this leakage current becomes large enough, it will act like conventional gate current and will turn on the thyristor when it is supposed to be off.

In order to test the blocking operation of a thyristor, including the effect of the inversion layer, the gate is connected to the cathode through a resistor 34, usually 1000 ohms. The anode is coupled to V+, whereas the cathode is connected to V− through a small current sensing resistor 36. This reverse biases the junction between N− layer 14 and P layer 16 to provide forward blocking of current from cathode to anode. A predetermined voltage is applied to the device with the device being maintained at a predetermined temperature. The leakage current $I_L$ is sensed across resistor 36. The leakage current is made up of the relatively small leakage from anode directly to cathode over path 38 and the leakage over path 32. After corona discharge treatment, the leakage current over path 32 can be reduced by over two orders of magnitude.

The above measurement not only measures the extent of the inversion layer, it also measures the operation of the thyristor in terms of the gain of the thyristor. The gain of the thyristor makes; the thyristor much more sensitive to inversion layer leakage. When the passivation layer is treated with a corona discharge, $I_L$ can be reduced by more than two orders of magnitude despite the gain effect.

Note that inversion layer leakage alone can be measured by shorting the gate to the cathode. Here too, more than two orders of magnitude improvement can be measured in terms of the decrease in leakage current after corona discharge treatment.

Figure 2:
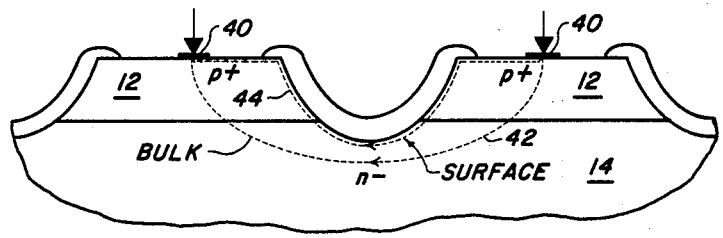
FIG. 2 is a diagrammatic illustration of I-V probing of a wafer prior to scribing, showing a bulk leakage path and a surface leakage path.
Figure 3:
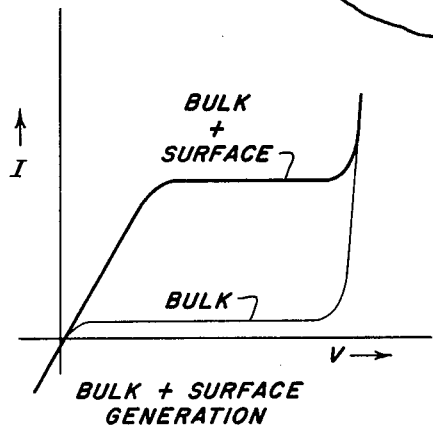
FIG. 3 is a graph illustrating the effects of bulk leakage and surface leakage when a wafer is probed in the manner illustrated in FIG. 2.

Another way of measuring the extent of the induced inversion layer is illustrated in FIG. 2 and corresponds to the aforementioned I-V probing. Here adjacent anodes 40 are provided with a potential difference so as to cause bulk leakage over path 42 and surface leakage over path 44. When, as illustrated in FIG. 3, leakage current is graphed against applied voltage, there is a significant difference in current generation due to bulk and surface effects. By I-V probing it is possible to directly measure the extent of the inversion layer caused by passivation layer charge. Note that this type I-V probing can be used to establish the charge creation conditions of the passivation layer in which a test passivation layer is subjected to greater and greater temperatures over a set time period or is subjected to the same temperature over greater and greater periods of time, while all the time monitoring the surface leakage current to monitor when the surface leakage current increases above a predetermined level.

Figure 4:
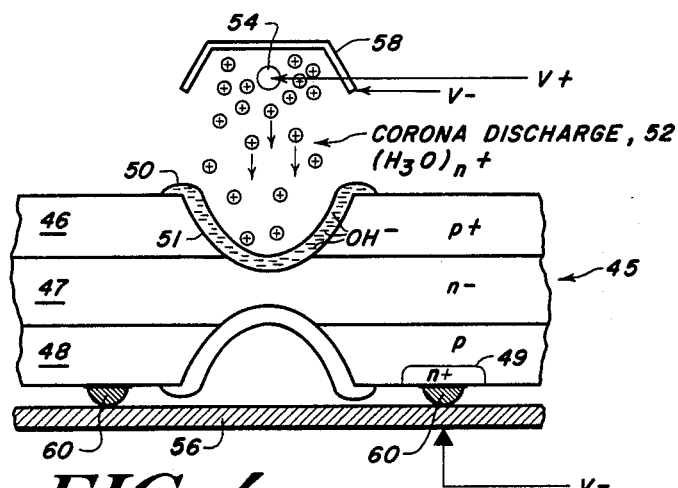
FIG. 4 is a diagrammatic illustration of the utilization of a corona discharge for reducing or eliminating the negative charge carried in a passivation layer of a wafer connected at its solder terminals to a negative supply voltage.

In order to eliminate or substantially reduce the creation of the inversion channel and referring now to FIG. 4, a PNPN device 45 having layers 46, 47, 48, and 49 of alternating conductivity type, when provided with a passivation layer 50 is a moat 51, is heated the desired temperature and is subjected to a corona discharge 52 involving ions, which drift towards layer 50 due to a field induced through the provision of V+ at a corona wire 54 and V− at a ground plane 56. Additionally, a shield 58 at V− is provided around the corona discharge wire.

In one embodiment, the corona wire is provided with a positive voltage in excess of 5,000 volts, with the ground plane being provided with a negative voltage. Note that the semiconductor device is connected to ground plane 56 by solder bumps 60 which may be either at the gate or cathode of the device. This establishes the entire semiconductor device at V− and produces a field so that the positive ions drift towards layer 50. As mentioned, it is thought that the passivation layer charge is neutralized chemically in which OH− ions combine with $H_3O^+$ ions to yield $H_2O$.

EXAMPLE I

Figure 5:
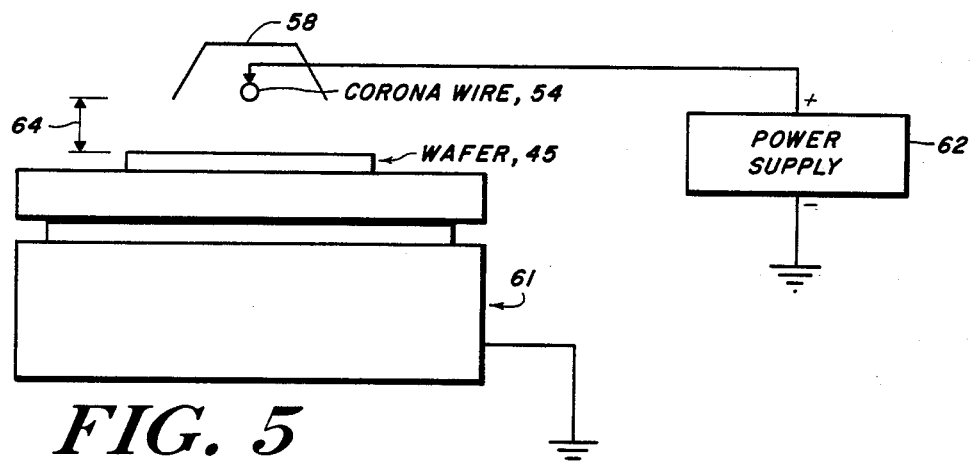
FIG. 5 is a generalized diagrammatic illustration of apparatus for use in treating a semiconductor wafer so as to eliminate or minimize leakage currents associated with the charge carried in a passivation layer; and, FIG. 6 is a block diagram illustrating the steps for use in processing a wafer for reducing leakage currents.

Referring to FIG. 5, wafer 45 may be supported on a hot plate 61 which is grounded, with corona wire 54 being provided with power from a power supply 62. In one operative embodiment, corona wire 54 is located one centimeter above the surface of wafer 40 having an IP830 glass passivation layer as illustrated by arrow 64 and the wafer is heated to a temperature of between 315° C. and 325° C. by the hot plate. Thereafter, a positive voltage is applied to the corona wire for, in one embodiment one-half hour. Assuming a double-sided device, one in which passivation layers are on top and bottom, the wafer is turned over after one-half hour and the bottom is then subjected to one-half hour's worth of corona discharge. At the end of the corona discharge cycle, either the corona discharge may be left on and the wafer cooled to ambient temperature at which point the corona discharge is turned off, or the corona discharge is first turned off followed by rapid cooling of the wafer or immediate removal from the hot plate.

If the corona discharge is turned off prior to cooling of the wafter, then the process steps are designed to lie in a region of the time/temperature graph below the time/temperature curve.

However, if the wafer is cooled while simultaneously being subjected to the corona discharge, then the corona discharge prevents the inversion layer from forming regardless of the temperature to which the wafer is heated. In general, the corona discharge is maintained until the passivation layer drops below the charge creation temperature.

Figure 6:
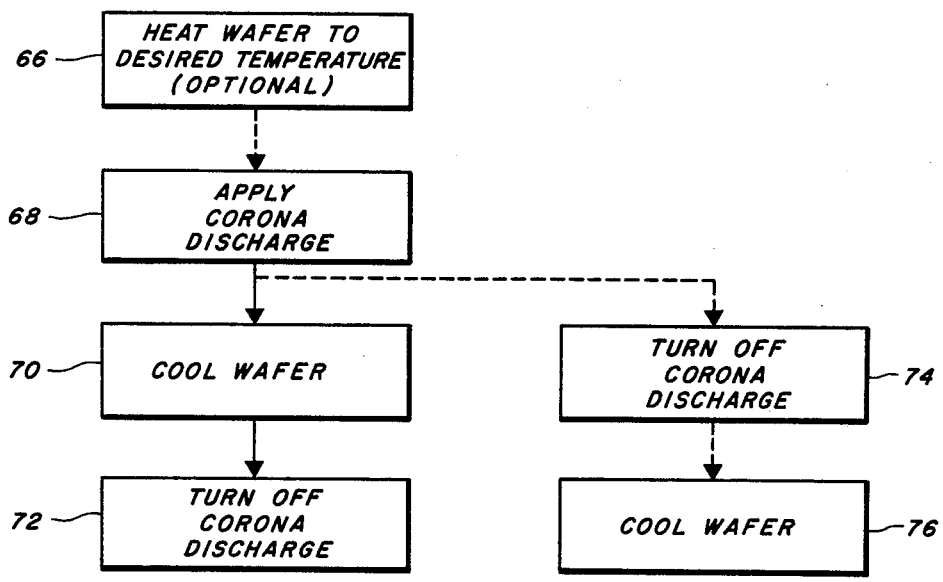

These steps are illustrated in FIG. 6 at boxes 66–76, respectively, which refer to the generic steps of the process. Note the step of box 66 is optional. Although the application of heat aids in the speed of the process, all that is required is a corona discharge for a time sufficient to reduce or eliminate the inversion layer.

EXAMPLE II

In another embodiment, the corona wire consists of a taut thin wire, for instance, one mil in diameter, made of tungsten, which is insulated from a holding frame (not shown). The passivation glass used in Innotech IP820. The hot plate is heated to approximately 300° C., with the corona wire being positioned approximately one centimeter above the wafer. 8,000 volts is applied between the corona wire and ground, with the corona being applied for approximately one-half hour during which time the corona wire may be moved in a horizontal plane parallel to the wafer surface a few times. The hot plate is turned off with the corona voltage being maintained on. When the temperature of the wafer drops below approximately 50° C., the corona voltage is turned off and the wafer is removed. As a result of the above treatment, low voltage leakage current between the P type regions of two adjacent die on the side exposed to the corona is reduced. Table I below sets forth the leakage currents between adjacent P regions for the wafer before and after treatment in the above manner:

| Conditions | Applied Voltage | | | |
|---|---|---|---|---|
| | 10 V | 20 V | 40 V | 80 V |
| Before Treatment | 1.0 A | 1.28 A | 1.6 A | 1.9 A |
| | 1.25 | 1.55 | 1.7 | 2.4 |
| After Treatment | 180 nA | 210 nA | 250 nA | 300 nA |
| | 200 nA | 240 nA | 280 nA | 340 nA |

Nine out of ten devices treated as in Example II survived a preliminary high temperature reverse bias (HTRB) test involving 110° C., 400 volts, 312 hours with no breakdown and with no increased leakage over time. Thereafter, the device was stored at 150° C. for 270 hours. Five devices showed no significant change in average room temperature leakage current (23–21 nanoamperes at 100 volts) or in average breakdown voltage (765 v. to 790 v. forward, 810 v. to 709 v. reverse).

In other tests it was found that while the average leakage current increases during the test, the final value of the leakage current is well below the turn-on threshold for the device and is significantly less than previous untreated devices.

EXAMPLE III

In order to determine the time and temperature threshold leading to significant reduction of the thyristor leakage current as brought about by the corona treatment which is subject of the present invention, the current between adjacent anodes of a wafer containing an array of thyristors passivated with IP820 glass was measured at successive times, between which the wafer was subject to corona discharge.

In one instance, the temperature and corona conditions were held identical to those of Example I, except that the treatment time duration was varied. Note that the passivation glass is different.

The measured leakage currents for two samples are tabulated:

| | Current ( A) | |
|---|---|---|
| Cumulative Treatment Time | Sample 1 | Sample 2 |
| 0 | 3.3 | 3.6 |
| 1 | 3.4 | 3.5 |
| 4 | 3.4 | 3.1 |
| 10 | 3.0 | 2.7 |
| 20 | 2.5 | 1.3 |
| 40 | 2.5 | 0.45 |
| 100 | 0.23 | 0.16 |

These figures illustrate that under stated conditions, significant decrease in leakage current occurs at 20–100 minutes of treatment time. The exact amount of time would depend on the amount of negative charge existing initially.

It should be noted that the polarity of the corona ions, the wafer temperature, and the duration of the treatment process are variables. While the best values for treatment of each device sealed with a particular glass will necessarily be different, it has generally been found that for proper passivation of any device the glass charge must be properly set. The subject corona discharge heated wafer system provides for such control.

Moreover, it has been found that the charge of a treated passivation layer reverts to its original and undesirable negative value following temperature/time conditions exceeding those associated with the charge creation conditions. For several glass passivation layers tested, original negative values were reached at temperatures corresponding to nickel sinter, i.e. 650° C. for ten minutes. It has, however, been found that solder temperatures (300° C.) and times (15 minutes) do not affect the passivation glass charge. That is, room temperature leakage currents remain below 100 nanoamperes following solder dipping at approximately 300° C.

Having above indicated a preferred embodiment of the present invention, it will occur to those skilled in the art that modifications and alternatives can be practiced within the spirit of the invention. It is accordingly intended to define the scope of the invention only as indicated in the following claims.

What is claimed is:

1. A method of reducing leakage currents from ions in nonpassivated portions within a multilayer semiconductor device comprising the steps of:
    passivating a portion of the surface of said multilayer semiconductor device;

generating a corona discharge at a V+ potential which produces ions which drift from said corona discharge to a V— potential;

placing said multilayer semiconductor device between said V+ and V— potentials to urge the ions to drift to said passivated portion, wherein the leakage currents from nonpassivated portions are reduced by neutralizing the ions within said multilayer semiconductor device by said ions resulting from said corona discharge.

2. The method of claim 1, wherein
said passivated portion comprises a moat.

3. The method of claim 2, further comprising the steps of:

providing a semiconductor device in wafer form with at least one active region and a non-alkaline glass passivation portion, the passivation portion being formed in a last high temperature process step in the wafer fabrication in which the glass temperature is raised to the firing temperature of the glass, no further processing steps employing conditions resulting in charge creation; and heating the device above ambient temperature.

4. The method of claim 2, further comprising the steps of:

providing a semiconductor device with at least one active region and a nonalkaline glass passivation portion, the passivation portion being formed in a last high temperature process step in device formation in which the glass temperature is raised to the firing temperature of the glass, no further processing steps employing conditions resulting in charge creation;

heating the device above ambient temperature.

5. The method of claim 4 wherein the temperature to which the passivation layer is heated is below that charge creation temperature associated with the cooling time.

6. The method of claim 4 wherein the corona discharge results in the reduction of the inversion layer caused by the charge acquired by the passivation layer and wherein the reduction in the inversion layer is detected by a shift in the bulk and surface generation to that associated with bulk generation alone.

7. The method of claim 2 and further including the step of heating the semiconductor device during corona discharge.

8. The method of claim 7 and further including the steps of cooling said semiconductor device and maintaining said corona discharge during cooling.

9. The method of claim 2, wherein said multilayer semiconductor comprises a top and a bottom layer, each having a moat thereon, said method further comprising the steps of:

inverting said multilayer semiconductor; and replacing said multilayer semiconductor between said V+ and V— potentials.

10. The method of claim 1, wherein said V— potential comprises a ground plane.

11. The method of claim 1, further including the step of:

electrically connecting said multilayer semiconductor to said V— potential.

12. The method of claim 11, wherein
said step of electrically connecting said multilayer semiconductor comprises electrically connecting the surface of the layer of said multilayer semiconductor which is distal from said passivated portion.

13. The method of claim 1, further including the step of:

passivating a portion of the device with non-alkaline glass in a last high temperature process step in which the temperature of the glass is raised to the firing temperature of the glass in which no further processing step employs conditions which result in charge creation, and subjecting the passivated portion of the device to appropriately charged ions from a corona discharge.

14. The method of claim 13 and further including the step of heating the semiconductor device during the time that the passivation layer is subjected to appropriately charged ions.

15. The method of claim 14 and further including the steps of cooling said semiconductor device and subjecting said device to said ions during cooling of said semiconductor device.

* * * * *

UNITED STATES PATENT AND TRADEMARK OFFICE
CERTIFICATE OF CORRECTION

PATENT NO. : 4,551,353 (Sheet 1 of 2)
DATED : November 5, 1985
INVENTOR(S) : Philip L. Hower; Eric K. Li It is certified that error appears in the above-identified patent and that said Letters Patent is hereby corrected as shown below:

| | | |
|---|---|---|
| Column 1, | line 60, | "tunr-on" should read --turn-on--. |
| Column 2, | line 60, | "any types" should read --many types--. |
| Column 3, | line 36, | "$(H_3O)^{30}$" should read --$(H_3O)^+$--. |
| | line 62, | "adhacent" should read --adjacent--. |
| Column 4, | line 44, | "Note the the" should read --Note the--. |
| | line 51, | "takin" should read --taken--. |
| Column 5, | line 26, | "finsihed" should read --finished--. |
| Column 6, | line 7, | "thyristor makes; the" should read --thyristor makes the--. |
| | line 40, | "is a moat 51," should read --in a moat 51,--. |
| Column 7, | line 12, | "wafter" should read --wafer--. |
| | line 33, | "used in" should read --used is--. |
| | line 50, | ""TABLE I" should be inserted here |
| | line 53, | "1.0 A; 1.28 A; 1.6 A; 1.9 A" should read --1.0µA; 1.28µA; 1.6µA; 1.9µA--. |

UNITED STATES PATENT AND TRADEMARK OFFICE
CERTIFICATE OF CORRECTION

PATENT NO. : 4,551,353

DATED : November 5, 1985

INVENTOR(S) : Philip L. Hower; Eric K. Li

It is certified that error appears in the above-identified patent and that said Letters Patent is hereby corrected as shown below:

Column 8, line 22, "Current ( A)" should read --Current ($\mu$A)--.

Column 9, line 29, "nonalkaline" should read --non-alkaline--.

Signed and Sealed this

Fourteenth Day of October, 1986

[SEAL]

*Attest:*

DONALD J. QUIGG

*Attesting Officer*     *Commissioner of Patents and Trademarks*